(12) United States Patent
Dressel et al.

(10) Patent No.: US 10,847,778 B2
(45) Date of Patent: Nov. 24, 2020

(54) COOLING LANCE AND ELECTRICAL CONTACT ARRANGEMENT WITH A COOLING LANCE

(71) Applicant: TE Connectivity Germany GmbH, Bensheim (DE)

(72) Inventors: Andre Martin Dressel, Lampertheim (DE); Gerzson Toth, Mannheim (DE); Rudi Blumenschein, Ellwangen (DE); Frank Kaehny, Lautertal (DE)

(73) Assignee: TE Connectivity Germany GmbH, Bensheim (DE)

( * ) Notice: Subject to any disclaimer, the term of this patent is extended or adjusted under 35 U.S.C. 154(b) by 0 days.

(21) Appl. No.: 16/540,246

(22) Filed: Aug. 14, 2019

(65) Prior Publication Data
US 2020/0058920 A1  Feb. 20, 2020

(30) Foreign Application Priority Data

Aug. 14, 2018 (DE) ........................ 10 2018 213 637

(51) Int. Cl.
| | |
|---|---|
| *H01R 9/11* | (2006.01) |
| *H01M 2/34* | (2006.01) |
| *B60L 58/26* | (2019.01) |
| *H01M 2/20* | (2006.01) |
| *H01R 4/34* | (2006.01) |
| *H01R 11/28* | (2006.01) |
| *H01L 23/46* | (2006.01) |
| *H01L 23/40* | (2006.01) |

(Continued)

(52) U.S. Cl.
CPC ............ *H01M 2/348* (2013.01); *B60L 58/26* (2019.02); *H01M 2/206* (2013.01); *H01L 23/4006* (2013.01); *H01L 23/46* (2013.01); *H01L 2224/0557* (2013.01); *H01R 4/34* (2013.01); *H01R 9/11* (2013.01); *H01R 11/281* (2013.01); *H01R 11/288* (2013.01); *H01R 13/005* (2013.01); *H01R 13/533* (2013.01)

(58) Field of Classification Search
CPC ................. H01L 23/4006; H01L 23/46; H01L 2224/0557; H01L 23/473; H01R 13/005; H01R 13/533; H01R 9/11; H01R 4/34; H01R 11/281; H01R 11/288
USPC ................................. 439/196, 485, 486, 487
See application file for complete search history.

(56) References Cited

U.S. PATENT DOCUMENTS

| | | | |
|---|---|---|---|
| 5,780,770 A | | 7/1998 | Christianson et al. |
| 6,575,966 B2 | * | 6/2003 | Lane .................. A61B 18/02 606/21 |

(Continued)

FOREIGN PATENT DOCUMENTS

| | | | | |
|---|---|---|---|---|
| DE | 19921310 A1 | * | 11/2000 | ............ B60L 53/302 |
| DE | 19921310 A1 | | 11/2000 | |
| DE | 602 23 152 T2 | | 8/2008 | |

OTHER PUBLICATIONS

German Office Action, dated Apr. 29, 2019, 5 pages.
European Search Report, dated Jan. 27, 2020, 6 pages.

*Primary Examiner* — Abdullah A Riyami
*Assistant Examiner* — Justin M Kratt
(74) *Attorney, Agent, or Firm* — Barley Snyder

(57) ABSTRACT

A cooling lance is provided to cool an electrically conductive contact body. The cooling lance includes a lance body, a fluid line extending through the lance body, and a flexible cooling bladder positioned on an end of the lance body and in fluidic communication with the fluid line.

27 Claims, 2 Drawing Sheets

(51) Int. Cl.
*H01R 13/533* (2006.01)
*H01R 13/00* (2006.01)

(56) References Cited

U.S. PATENT DOCUMENTS

2014/0377990 A1* 12/2014 Saller ................. H01R 4/10
439/582
2015/0270586 A1    9/2015 Wang et al.

* cited by examiner

COOLING LANCE AND ELECTRICAL CONTACT ARRANGEMENT WITH A COOLING LANCE

CROSS-REFERENCE TO RELATED APPLICATION

This application claims the benefit of the filing date under 35 U.S.C. § 119(a)-(d) of German Patent Application No. DE 102018213637.8, filed on Aug. 14, 2018.

FILED OF THE INVENTION

The invention relates to a cooling lance and, more particularly, to a cooling lance for cooling an electrically conductive contact body

BACKGROUND

Connectors having a cooling lance are known in prior art. Electrically conductive contact bodies for connecting battery modules, which are made up of several mutually interconnected battery cells, or also for connecting a battery disconnect unit to a battery module, are frequently used. In this case, high currents flow through a contact body, which generate resistance heat. Thermal loads can further arise through heat sources, such as occur in, for example, an engine and/or a battery, and among other things can lead to an embrittlement in a contact region of the connector, with the result that the connector can break down again. Furthermore, a heated-up contact body can lead to excessive heating-up of the electrical conductor associated therewith.

In the case of a connection to a battery module, in particular the battery cell directly interconnected with the contact body can heat up above a critical operating temperature, with the result that the lifespan and the performance of the connector can decrease dramatically. Thus, cooling of the contact body is necessary. In vehicles in particular, great demands are placed on the cooling apparatus. Therefore, it should be as low-weight as possible, guarantee optimal transfer of thermal energy and contact the area to be cooled well and constantly over the service life.

In view of the aforementioned problems, there is a need for a cooling lance, as well as an electrical connector with a cooling lance, which guarantees improved and constant cooling performance.

SUMMARY

A cooling lance is provided to cool an electrically conductive contact body. The cooling lance includes a lance body, a fluid line extending through the lance body, and a flexible cooling bladder positioned on an end of the lance body and in fluidic communication with the fluid line.

BRIEF DESCRIPTION OF THE DRAWINGS

The invention will now be described by way of example with reference to the accompanying Figures, of which.

DETAILED DESCRIPTION OF THE EMBODIMENTS

Figure 1:
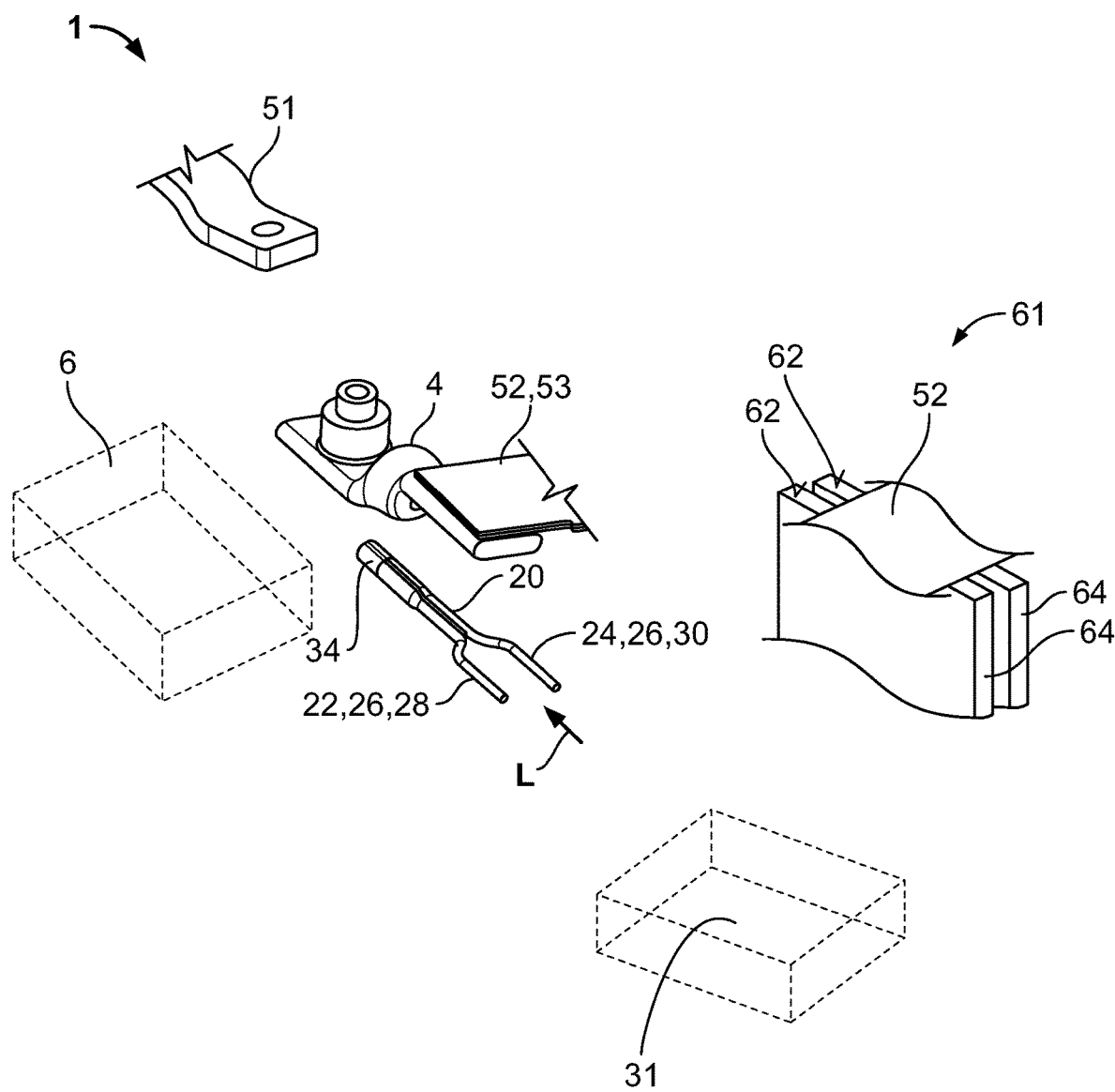
FIG. 1 is an exploded view of an electrical contact assembly having a cooling lance according to the invention.

An exemplary embodiment of the invention will be described hereinafter in detail with reference to the attached drawings, wherein like reference numerals refer to the like elements. The present invention may, however, be embodied in many different forms and should not be construed as being limited to the embodiments set forth herein; rather, these embodiments are provided so that the disclosure will be thorough and complete, and will fully convey the concept of the invention to those skilled in the art.

Now with reference to FIGS. 1-4, an electrical connector 1 to the invention is shown. The electrical connector 1 generally includes a cooling lance 2 and an electrically conductive contact body 4. At least the electrically conductive contact body 4 is surrounded by an electrically insulating housing 6 (depicted schematically). The housing 6 can furthermore have several supports spaced apart in a longitudinal direction L, on which supports the cooling lance 2 can rest (not shown). The supports can be formed, for example, by wall portions with a depression which are arranged transversely to the longitudinal direction L. The depressions of successive wall portions can align with one another, so that they form a channel into which the cooling lance 2 can be inserted. The supports can prevent large relative movements between contact body 4 and cooling lance 2, which are caused owing to mechanical loads, such as for example by vibrations in a vehicle, with the result that breaking-apart of the connector 1 can be avoided.

Figure 2:
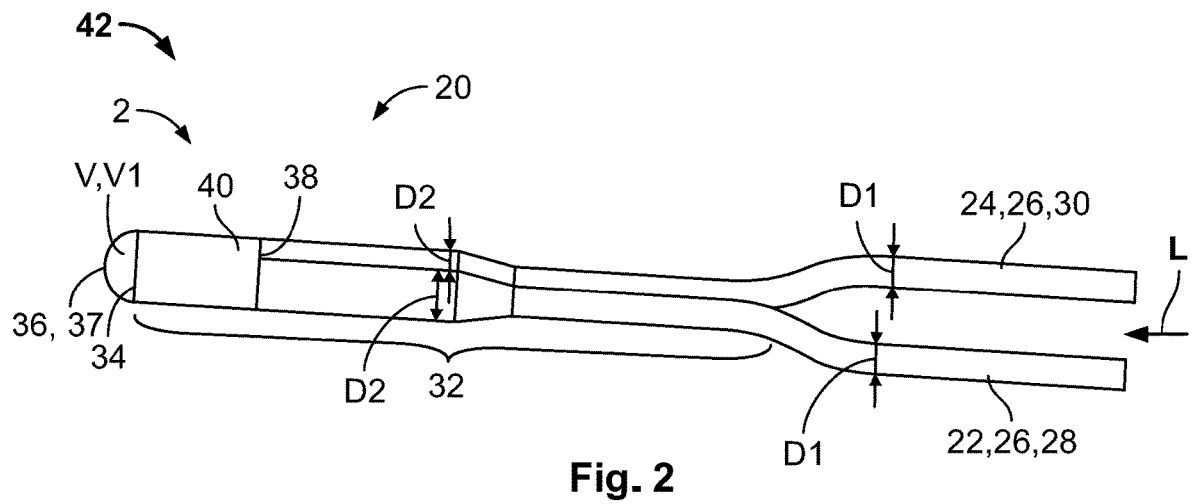
FIG. 2 is a perspective view of a cooling lance according to the invention having an emptied cooling bladder.
Figure 3:
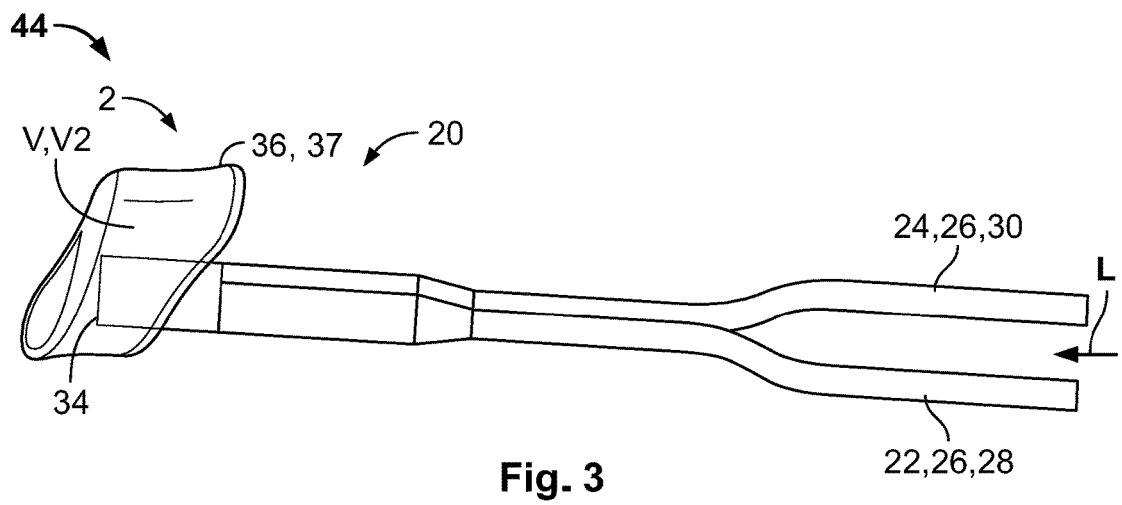
FIG. 3 is a perspective view of the cooling lance of FIG. 2 now shown with a filled cooling bladder.

Now with reference to FIGS. 2 and 3, a cooling lance 2 according to the invention is shown.

The cooling lance 2 includes a lance body 20, which is formed from two tubular bodies 22, 24 that are symmetrically arranged in relation to one another at least in sections along the longitudinal direction L. The tubular bodies 22, 24 each form a fluid line 26. In the shown embodiment, the tubular body 22 functions as a fluid inlet 28 and the tubular body 24 functions as a fluid outlet 30. The fluid inlet 28 and the fluid outlet 30 can be connected in a coolant circuit (not depicted). The fluid lines 26 can be in fluidic communication with a pump (not shown), with the result that the fluid flow can be controlled and can be pumped through the fluid line 26. The fluid lines 26 can be attached directly to the pump 31, or can be connected in a coolant circuit operated by the pump 31.

The fluid inlet 28 and the fluid outlet 30 run parallel next to one another with respect to the longitudinal direction L along an end portion 32 of the lance body 20, and are connected to one another preferably rigidly, even materially in particular as a monolithic structural part, so that at least in the end portion relative movements between the fluid lines 26 are avoided. As a result, high mechanical stability of the lance body 20 is achieved.

In an exemplary embodiment, the fluid inlet 28 and the fluid outlet 30 can be connected to one another, at least in sections, rigidly or even materially, in particular monolithically. Therefore, the fluid inlet 28 and the fluid outlet 30 can be produced in an injection-molding process, it being possible for the fluid inlet 28 and the fluid outlet 30 each to be formed by a tubular body, and being connected to one another in a way that transfers movement at least in sections. Therefore, fluctuations caused by mechanical loads, such as impact loads or vibration loads, can be attenuated and a relative movement between the fluid inlet and fluid outlet can be prevented. As a result, the cooling bladder 36 connected between the fluid inlet 28 and fluid outlet 30 and/or its connection to the fluid inlet 28 and/or fluid outlet 30 can be prevented from being torn off or damaged in some way.

Preferably, a cooling liquid such as water may run through the cooling lance 2, which has good thermal conductivity and is chemically inert with respect to the material of the cooling lance 2, so that a chemical decomposition of the cooling lance 2 can be prevented. The decomposition can result, for example, in a loss of insulation of the fluid from the contact body 4 and/or an undesired escape of the coolant.

In an exemplary embodiment of the invention, the lance body 20 may be manufactured using an injection-molding process. The lance body 20 may be made of a mechanically robust and electrically insulating material, so that transfer of current between the contact body 4 and the fluid situated in the interior of the lance body 20 is prevented. As a result, safe operation without additional insulation of the lance body 20 can be guaranteed. An additional insulation would lead to a higher weight and a larger space requirement.

The lance body 20 can be manufactured from an electrically insulating polymer, which has a low weight. Thus, the lance body 20 can be electrically insulating, in order to avoid a disruptive discharge. Furthermore, according to exemplary embodiment, at least the at least one fluid line 26 of the lance body 20 can be mechanically robust, so that the cooling lance 2 can withstand mechanical stress, such as vibrations and impacts for example. As an alternative to this, the lance body 20 can also be manufactured from a metal, for example from copper or a copper alloy, it being possible in this case for the lance body 20 to be wrapped around by an electrically insulating foil or to be electrically insulated from the outside in some other way known to the person skilled in the art.

In the end portion 32, the fluid lines 26 are arranged parallel to one another and their diameter increases from a diameter D1 to a diameter D2 in the longitudinal direction L. Preferably, in this case only the outer diameter increases when the inner diameter remains the same. As a result, the material thickness of the lance body 20 in the end portion 32 can be increased, with the result that a higher mechanical strength is achieved.

The fluid lines 26 open with their free ends 34 into a flexible cooling bladder 36, which encloses a volume space V. The flexible cooling bladder 36 is provided with a fluid receiving space 38, which engages around a longitudinal portion of the lance body 20, and is materially connected to the longitudinal portion using an adhesive connection 40. As a result, a fluid can be conducted in the cooling bladder 36, it being ensured that the fluid does not escape in an undesired manner from the cooling bladder 36 into the environment. The adhesive connection 40 is preferably produced from an adhesive which is thermally stable at least in the employed temperature range of approximately −40° C. to approximately 60° C., and from at least one adhesive which is chemically stable at least with respect to an employed cooling fluid. The free ends 34 of the fluid lines 26 protrude, in this case, into the volume space V, with the result that the cooling fluid is pumped centrally into the cooling bladder 36, instead of from one side. As a result, homogeneous temperature distribution in the volume space V can be obtained, and consequently homogeneous cooling of the contact body can also be achieved.

The lance body 20 can in particular have at least one elongate tubular body, which can be coolant-resistant and which forms at least one fluid line 26 that can have a fluid flow through it. The fluid line 26 can be thermally insulated, so that a coolant flowing through the fluid line 26 is not heated excessively by the warm ambient space, before the coolant is introduced into the cooling bladder 36. As a result, higher cooling efficiency is possible. Furthermore, the occurrence of condensation can be avoided.

As an alternative to this, according to an embodiment not shown, the cooling bladder 36 and the fluid lines 26 can be manufactured in one piece as a monolithic structural part, the cooling bladder 36 being designed to be flexibly expandable and/or inflatable and the fluid lines 26 being substantially mechanically robust. Therefore, the monolithic structural part can be produced inexpensively in only one operation in a multi-component injection-molding process.

The flexible cooling bladder 36 may be manufactured from an elastic membrane 37, which possesses dielectric properties, and thus prevents a disruptive discharge between contact body 4 and cooling fluid. By way of the elastic properties of the membrane 37, the cooling bladder can be deformed in a reversibly elastic manner. Insulating a recess in the contact body 4 is associated with great outlay and costs. Since the cooling bladder 36 itself, however, may be made of a membrane 37 with dielectric properties, an undesired flow of current can be prevented and a simple and inexpensive solution for the electrical insulation of the connector 1, in particularly of the contact body 4, is obtained.

In FIG. 2, the flexible cooling bladder 36 is depicted in an emptied state 42, in which the cooling bladder 36 is substantially tension-free and encloses a volume space V1. In the emptied state 42, the cooling bladder 36 can be spaced apart from a contact area of the contact body 4. In this regard, the emptied state 42 is not limited to a completely emptied cooling bladder, rather this only means that the cooling bladder 36 is not filled with a cooling fluid to the extent that the cooling bladder 36 contacts a contact area of the contact body 4 and a heat exchange between cooling fluid and contact body 4 can take place.

The elastic membrane 37 of the flexible cooling bladder 36 may have a small material thickness, and is at least inflatable, but preferably also expandable. By way of the pump, the cooling fluid can be pumped into the cooling bladder 36 using the fluid inlet 28. As a result, the internal pressure in the volume space V rises, which leads to an enlargement to a volume space V2, as depicted in FIG. 3. If no more fluid is conveyed through the fluid inlet 28 into the cooling bladder 36, the membrane can contract again, pump the fluid through the fluid outlet 30 and assume the emptied state 42.

According to an exemplary embodiment, the membrane 37 can be made of a material which is stable at least in the temperature range of the field of use. Therefore, in particular the elastic behavior of the membrane 37 can be stable and not brittle. A brittle membrane can lead to tears and can result in an escape of the coolant. Therefore, the elasticity of the membrane 37 can be unchanged at approximately 60° C. in comparison with the elasticity of the cooling bladder 36 at approximately −40° C. The flexible cooling bladder 36 can be made, for example, from a vulcanized rubber or plastic, such as polyethylene for example.

According to another embodiment, not shown, the fluid outlet 30 can be provided with a valve (not shown), which opens only at a predetermined internal pressure of the cooling bladder 36, so that the cooling bladder 36 first assumes a predetermined volume space V, before the fluid flows out of the cooling bladder 36 through the fluid outlet

30. As a result, it can be ensured that the cooling bladder 36 is contacted sufficiently well by the contact body 4 with a certain pressing force, which arises as a result of the internal pressure of the cooling bladder 36. The cooling lance 2 shown in FIG. 3 shows the cooling bladder 36 in a filled state 44. The term "filled state" in this regard merely means that the cooling bladder 36 is filled sufficiently in order to contact a contact area of the contact body 4 with a desired force. The cooling bladder 36 may be filled far beyond the filled state. As a result, it is guaranteed that sufficient volume capacity is present in the cooling bladder 36, before the cooling bladder 36 bursts. The filled state 44 can vary over the period of operation, for example when the contact area is changed by way of thermal deformation of the contact body 4. Therefore, the cooling bladder 36 can adapt to the thermal deformation and, where appropriate, expand further.

The fluid outlet 30 may connect to or include a valve, for example, so that the cooling bladder 36 can first be filled with a fluid and can inflate and/or expand, before the valve for the fluid outlet 30 opens. The valve can be formed in such a way that it enables discharge of the fluid from the cooling bladder 36 only after a predetermined internal pressure in the volume space of the cooling bladder 36. According to an exemplary embodiment, a valve can be set in relation to the pressure at which it opens, so that the internal pressure in the volume space, and thus the expansion of the cooling bladder 36, can be regulated.

The fluid outlet 30 and the fluid inlet 28 can be connected in parallel, preferably after the predetermined internal pressure of the cooling bladder 36 has been reached. The fluid flow can thus flow steadily through the cooling bladder 36, with the result that the internal pressure remains substantially constant, the contact area is contacted lastingly with the same force and a consistent cooling performance which can be designed simply in computational terms is achieved.

As an alternative to this, the fluid inlet 28 and the fluid outlet 30 can be connected in parallel already from the beginning onwards, the current flow being non-steady at the beginning, while the cooling bladder fills up, so that the inlet flow of fluid is higher than the outlet flow, until the cooling bladder 36 reaches the filled state 44. In particular after the cooling bladder has reached the filled state 44, the current flow can be steady, so that the internal pressure prevailing in the volume space V remains constant.

The cooling bladder 36 can have a constant material thickness in the tensioned and relaxed state and thus offers a certain tear resistance. It has proven particularly advantageous when the cooling bladder 36 expands during filling, so that the material thickness of the membrane 37 is smaller in the filled state 44 than in the emptied state 42. By way of this configuration, the thermal transmission resistance of the membrane falls and the thermal conductivity of the cooling lance 2 rises, with the result that a particularly effective cooling of the contact body 4 is achieved. The volume space V2 in the filled state 44 can be a multiple of the volume space V1 in the emptied state 42, depending on the application. Therefore, the expansion ratio between the cooling bladder in the filled state 44 and in the emptied state 42 can be 8:1.

Figure 4:
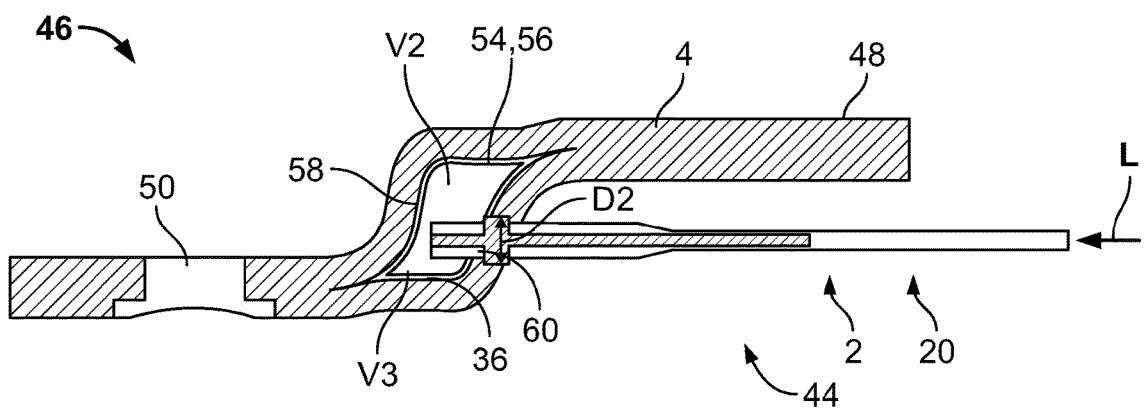
FIG. 4 is a cross-sectional view of an assembled electrical connector having a cooling lance according to the invention.

With reference to FIG. 4, an inventive connector 1 is shown and includes an electrically conductive contact body 4 and the cooling lance 2 shown in FIGS. 2 and 3.

The contact body 4 has a substantially step-shaped body, in each case a horizontal portion running substantially parallel to the longitudinal direction L forming a contact region 46, 48 for contacting an electrical conductor in each case. The contact body 4 can, for example, be made of two components, which are connected to one another, for example by diffusion soldering or welding, in each case one component forming a contact region 46, 48. Therefore, the contact region 46, for example, can be formed substantially from copper and the contact region 48 substantially from aluminum. "Substantially" in this case denotes alloys which predominantly contain said material. Thus, this does not preclude these elements from additionally containing further materials.

The contact regions 46, 48 may be formed by stamping and bending, with the result that simple production of the contact body 4 is enabled.

The contact region 46 is provided with a conductor receiving space 50, which can serve for connection to a first electrical conductor 51, which is depicted schematically in FIG. 1, and also for the mechanical fixing of the contact body 4. The conductor receiving space 50 can, for example, be provided with an internal thread for a screw connection. Overall, the contact region 46 can substantially have the shape of a cable lug.

The contact region 48 can likewise have the shape of a cable lug, but can also have no conductor receiving space like in the embodiment of the contact region 48 depicted in FIG. 4. In the event of a substantially identical material composition of the contact region 48 and of a second electrical conductor 53, the contact region 48 with the second electrical conductor 53, for example a cell connector 52 (see FIG. 1) of a battery module, can be produced easily by welding or other material connections.

At the transition between the contact regions 46, 48, which runs substantially perpendicular to the longitudinal direction L, the contact body 4 includes a recess 54 in the form of a chamber 56, which is enclosed by a wall 58. The chamber 56 describes a volume space V3 and has an lance receiving space 60 accessible in the longitudinal direction L, into which the cooling lance 2 is inserted, so that the cooling bladder 36 is arranged in the chamber 56. As a result, the cooling bladder 36 is protected by the wall 58 against external loads, in particular mechanical loads, such as vibrations or impacts. Thus, the membrane 37 of the cooling bladder 36 can be optimized for thermal transmission at the expense of mechanical robustness.

The lance body 20 is rigidly secured to the contact body 4 in the lance receiving space 60. For this purpose, an adhesive connection may be used and produced using a thermally conductive adhesive. By way of the rigid connection, the cooling bladder 36 can be prevented from being pulled out of the chamber 56 and/or damaged. Relative movements between the cooling lance 2 and the contact body 4 in the longitudinal direction L, and also transversely to the longitudinal direction L, can also be minimized. In this case, the lance body 20 may occlude the lance receiving space 60, and thus prevents the entry of particles which can lead to a lowering of the thermal conductivity and to damage to the membrane 37.

The free end 34 protrudes into the chamber 56, with the result that greater stability of the connection between lance body 20 and lance receiving space 60 is achieved. The connection is thereby not so easily released as a result of vibrations or other mechanical influences.

For cooling the contact body 4, the cooling fluid is pumped into the cooling bladder 36 using the coolant circuit, the cooling bladder 36 inflating and/or expanding up to the volume space V2 in this case. In this case, the cooling bladder 36 substantially assumes the volume space V3 and the outline of the chamber 56. This leads to the membrane 37 biasing the wall 58, and thus a large contact area is achieved between cooling bladder 36 and contact body 4. Since the cooling bladder 36 is arranged in the interior of the contact body 4, so to speak, a much larger contact area is contacted in contrast to cooling on a single outer side of the contact body 4. As a result, particularly homogeneous distribution of the cooling is achieved, and the contact area is maximized with a small space requirement. As a result of the internal pressure prevailing in the volume space V2, the membrane 37 is pressed against the wall 58, with the result that continuous contacting of the contact area is guaranteed.

Thus, according to the invention, an electrical connector 1 using a cooling lance 2, for cooling an electrically conductive contact body 4, is made simple and efficient, without the use of further components which could lead to an increase in weight.

In FIG. 1, it is further depicted that the contact body 4 is connected to a cell connector 52 of a battery module 61. The battery module 61 is only shown schematically for the sake of clarity, only two single battery cells 64 of a battery module 61 being shown. The cell connector 52 can, for example, be welded to an end face 62 of the battery cell 64. The battery modules 61 are cooled in a known manner, for example, by plate cooling. As a result of the ever increasing demands on charging capacities and speeds of batteries, excessive heating-up of the battery cells above a critical temperature occurs as a result of the high power consumption or high power output, with the result that the lifespan of the battery is shortened. In particular, the cell connector 52 connected to the contact body 4 is heated excessively by the heat of the contact body 4. By cooling the contact body 4 efficiently by means of the cooling lance 2, excessive heat which is transferred to the cell connector 52 can be prevented from forming, and thus can prevent the battery cell from heating beyond a critical operating temperature. Thus, the temperature of the battery module 61, in particular the battery cell 64 directly connected to the contact body, can be regulated indirectly by the cooling of the contact body, in addition to the plate cooling.

In an exemplary embodiment, the contact body 4 can, for example, connect two battery modules 61 together or also can be used to connect a battery disconnect unit (BDU) to a battery module 61. In this regard, particularly high current flows are conducted, with the result that in particular the first cell of the battery module 61 can be heated above a critical operating temperature, at which the lifespan and performance of the battery decrease. Thus, through the additional cooling of the contact body, the excessive heating-up can be counteracted and safe operation of the battery can be guaranteed.

In an exemplary embodiment, the electrical connector 1 can have a housing (not shown), which encloses the connector 1 at least partially, encloses at least the contact body 4 and gives protection from external influences. Therefore, the housing can be, in particular, electrically insulating, so that undesired transfer of current between the contact body 4 and the environment does not occur.

The foregoing illustrates some of the possibilities for practicing the invention. Many other embodiments are possible within the scope and spirit of the invention. The combination of features shown and described in the individual exemplary embodiments serves solely the purposes of explanation. The disclosed invention utilizes the above identified components, as a system, in order to more efficiently construct an electrical connector 1 for a particular purpose. Therefore, more or less of the aforementioned components can be used to conform to that particular purpose. In addition, according to the above statements, a further feature can be added in an exemplary embodiment if its technical effect is meant to be advantageous or necessary for a particular application. It is, therefore, intended that the foregoing description be regarded as illustrative rather than limiting, and that the scope of the invention is given by the appended claims together with their full range of equivalents.

What is claimed is:

1. A cooling lance for cooling an electrically conductive contact body, comprising:
   a lance body;
   a fluid line extending through the lance body; and
   a flexible cooling bladder positioned on an end of the lance body and in fluidic communication with the fluid line, the flexible cooling bladder is insertable into a cooling bladder receiving chamber of the electrically conductive contact body.

2. The cooling lance according to claim 1, wherein the lance body is an injection-molded monolithic piece.

3. The cooling lance according to claim 1, wherein the lance body includes a pair of tubular bodies that are symmetrically arranged in relation to one another.

4. The cooling lance according to claim 3, wherein the pair of tubular bodies form the fluid line.

5. The cooling lance according to claim 4, wherein a diameter of the fluid line increases from a diameter D1 to a diameter D2 along a longitudinal direction L of the lance body.

6. The cooling lance according to claim 3, wherein one of the pair of tubular bodies is a fluid inlet and another of the pair of tubular bodies is a fluid outlet.

7. The cooling lance according to claim 6, wherein the pair of tubular bodies open into the flexible cooling bladder.

8. The cooling lance according to claim 7, wherein the flexible cooling bladder is coolant-resistant.

9. The cooling lance according to claim 1, wherein the flexible cooling bladder is coolant-resistant.

10. The cooling lance according to claim 1, wherein the flexible cooling bladder is rigidly secured to the lance body.

11. The cooling lance according to claim 10, wherein the flexible cooling bladder is made of a material with dielectric properties.

12. The cooling lance according to claim 10, wherein the flexible cooling bladder is made from an elastic membrane.

13. The cooling lance according to claim 1, wherein the flexible cooling bladder has an expansion ratio of 8:1.

14. An electrical connector for connection of electrical conductors, comprising:
   an electrically conductive contact body having a cooling bladder receiving chamber;
   a cooling lance received by the contact body and having:
      a lance body;
      a fluid line passing through the lance body; and
      a flexible cooling bladder in fluidic communication with the fluid line and positioned in the cooling bladder receiving chamber.

15. The electrical connector according to claim 14, wherein the contact body includes a lance receiving space extending into the cooling bladder receiving chamber corresponding with the lance body.

16. The electrical connector according to claim 15, wherein the cooling lance is rigidly secured to the contact body.

17. The electrical connector according to claim 15, wherein the cooling bladder receiving chamber is occluded by the cooling lance.

18. The electrical connector according to claim 15, wherein the flexible cooling bladder expands and abuts against a wall of the cooling bladder receiving chamber when filled with a fluid.

19. The electrical connector according to claim 18, wherein the flexible cooling bladder contracts and is arranged tension-free in the cooling bladder receiving chamber when emptied of the fluid.

20. The electrical connector according to claim 14, further comprising a battery cell connected to the contact body.

21. The electrical connector according to claim 14, wherein the lance body includes a pair of tubular bodies that are symmetrically arranged in relation to one another.

22. The electrical connector according to claim 21, wherein the pair of tubular bodies form the fluid line.

23. The electrical connector according to claim 22, wherein a diameter of the fluid line increases from a diameter D1 to a diameter D2 along a longitudinal direction L of the lance body.

24. The electrical connector according to claim 23, wherein one of the pair of tubular bodies is a fluid inlet and another of the pair of tubular bodies is a fluid outlet.

25. The electrical connector according to claim 24, wherein the pair of tubular bodies open into the flexible cooling bladder.

26. The electrical connector according to claim 14, wherein the flexible cooling bladder is made from an elastic membrane.

27. The electrical connector according to claim 26, wherein the flexible cooling bladder has an expansion ratio of 8:1.

\* \* \* \* \*